(12) United States Patent
Aoki

(10) Patent No.: US 6,535,065 B2
(45) Date of Patent: Mar. 18, 2003

(54) VARIABLE-GAIN CIRCUIT

(75) Inventor: Yuuichi Aoki, Tokyo (JP)

(73) Assignee: NEC Corporation, Tokyo (JP)

(*) Notice: Subject to any disclaimer, the term of this patent is extended or adjusted under 35 U.S.C. 154(b) by 47 days.

(21) Appl. No.: 09/776,672

(22) Filed: Feb. 6, 2001

(65) Prior Publication Data
US 2001/0033199 A1 Oct. 25, 2001

(30) Foreign Application Priority Data
Feb. 7, 2000 (JP) ........................................ 2000-029836

(51) Int. Cl.⁷ ................................................ H03G 3/20
(52) U.S. Cl. .................................... 330/284; 330/285
(58) Field of Search ............................ 327/346; 330/134, 330/284, 285, 302

(56) References Cited

U.S. PATENT DOCUMENTS 5,994,964 A * 11/1999 Tanemura ................... 330/285
6,121,841 A * 9/2000 Sakuno ...................... 330/285

FOREIGN PATENT DOCUMENTS

| JP | 06-164249 | 6/1994 |
| JP | 10-260734 | 9/1998 |

* cited by examiner

Primary Examiner—Steven J. Mottola
(74) Attorney, Agent, or Firm—Sughrue Mion, PLLC

(57) ABSTRACT

A variable-gain circuit includes an amplifying transistor, a first gain control section for receiving a first gain control signal to control the amplifying transistor to have a first gain curve of decibel gain convex toward the bottom of graph, and a second gain control section for receiving a second control signal to control the first transistor to have a second gain curve of decibel gain convex toward the top of graph. The first and second control signals are fed at a time to cancel the non-linearity of the gain curves to have an overall linear gain curve.

12 Claims, 20 Drawing Sheets

BASE-EMITTER VOLTAGE (V)

BASE-EMITTER VOLTAGE (V)

VARIABLE-GAIN CIRCUIT

BACKGROUND OF THE INVENTION (a) Field of the Invention

The present invention relates to a variable-gain circuit and, more particularly, to a variable-gain circuit for use in an amplifier.

(b) Description of the Related Art

In a wireless communication system, the transmitted wave attenuates in an amount depending on the transmission distance. Especially, in a mobile communication such as a cellular phone system wherein the transmission distance differs depending on the location of the mobile station, a variable-gain circuit is generally used for correcting the attenuation. (or attenuated amount) corresponding to the transmission distance.

FIG. 1 shows transmission/reception blocks of a conventional mobile station, wherein each of a low-noise amplifier 103, an intermediate frequency amplifier 105, a driver amplifier 111 and the like includes a variable-gain circuit. Two of typical conventional variable-gain circuits will be exemplified for description.

FIG. 2 shows one of the conventional variable-gain circuits, which is described in JP-A-6-164249. A common emitter transistor 1 has a collector connected to a power supply source 10 via a load 2, through which an amplified output 4 is fed. The base of transistor 1 is connected to a base bias circuit 5 including resistors 51 and 52, and to a variable current source 6. The variable current source 6 includes a current source transistor 61 and a serial resistor 64 connected to the collector of transistor 61.

In the conventional variable-gain circuit of FIG. 2, the amplifying gain of the common emitter transistor 1 is varied by varying the base bias current of the variable current source 6. More specifically, the collector current of transistor 61 is varied by controlling the base input of transistor 61, whereby the base bias current of transistor 1 is varied to vary the gain of the common emitter transistor 1.

FIG. 3 shows another of the conventional variable-gain circuits, which is described in JP-A-10-260734. A common emitter transistor 1 has a collector connected to a power supply source 10 via a load 2, through which an amplified output 4 is fed. The base of transistor 1 is connected to a base bias circuit 5 including resistors 51 and 52, and to a variable-impedance circuit 8 via a DC-blocking capacitor 9. The variable-impedance circuit 8 includes a common base transistor 81 and an emitter resistor 84 thereof.

In the conventional variable-gain circuit of FIG. 3, the variable-impedance circuit 8 controls the shunt current of the input signal shunted toward the ground for obtaining the variable gain. The base of transistor 81 is grounded in terms of AC sense (or as viewed with respect to an AC signal), and thus the control of the base input voltage of transistor 81 varies the base-emitter impedance of transistor 81, whereby the shunt current of the input signal is controlled to vary the gain.

It is desired in the variable-gain circuit for designing the control voltage generator with ease that the gain curve, which is obtained by plotting the decibel gain of the variable-gain circuit the control voltage, be exactly a linear curve. However, the gain curve is actually not linear in the conventional variable-gain circuit. The conventional variable-gain circuit of FIG. 2 has a gain curve such as shown in FIG. 4, which is convex toward the top of the graph, whereas the conventional variable-gain circuit of FIG. 3 has a gain curve such as shown in FIG. 5, which is convex toward the bottom of the graph.

SUMMARY OF THE INVENTION

In view of the above problems in the conventional variable-gain circuits, it is an object of the present invention to provide a variable-gain circuit having an improved gain curve.

It is another object of the present invention to provide a variable-gain circuit capable of allowing an amplifier including the variable-gain circuit to have an improved amplification characteristic.

The present invention provides a variable-gain TO circuit including a functional circuit for receiving an input signal to output an output signal having a gain with respect the input signal, a first gain control section for receiving a first control signal to control the functional circuit to operate based on a first gain curve of decibel gain plotted in a graph against the first control signal, the first gain curve being convex toward a bottom of the graph, a second gain control section for receiving a second control signal to control the functional circuit to operate based on a second gain curve of decibel gain plotted in a graph against the second control voltage, the second gain curve being convex toward a top of the graph, the first and second control signals being applied so that said first gain curve and said second gain curve cancel each other in non-linearity.

In accordance of the variable-gain circuit of the present invention, since the first gain control section controls the functional circuit to have the gain curve which is convex toward the bottom of the graph and the second gain control section controls the functional circuit to have the gain curve which is convex toward the top of the graph, application of the first control signal to the first gain control section and the second control signal to the second control section allows the first gain curve and the second gain curve to cancel each other in the non-linearity, thereby improving the overall gain curve toward the linearity.

The above and other objects, features and advantages of the present invention will be more apparent from the following description, referring to the accompanying drawings.

PREFERRED EMBODIMENTS OF THE INVENTION

Figure 1:
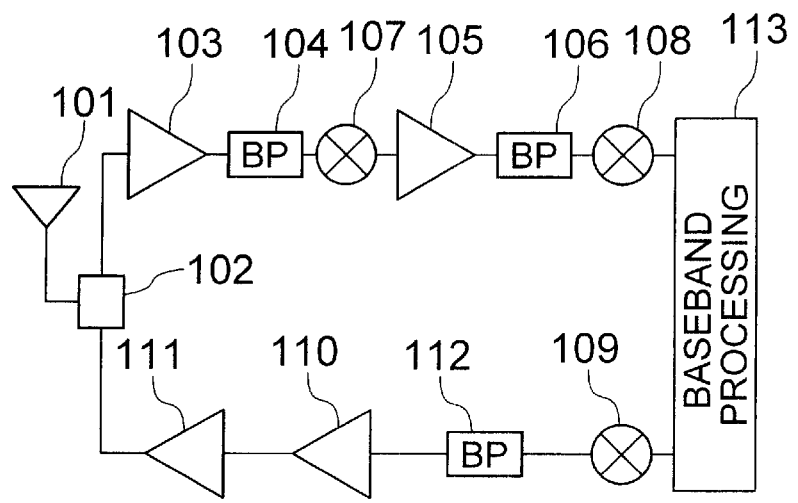
FIG. 1 is a block diagram of transmission/reception block of a mobile station.
Figure 2:
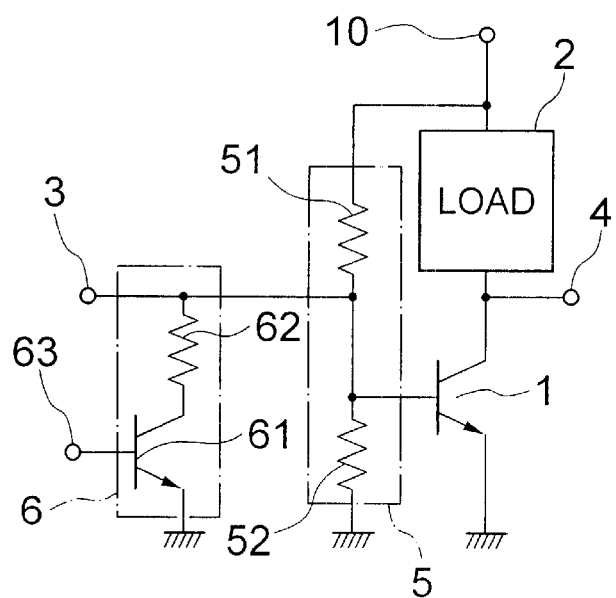
FIG. 2 is a circuit diagram of a conventional variable-gain circuit.
Figure 3:
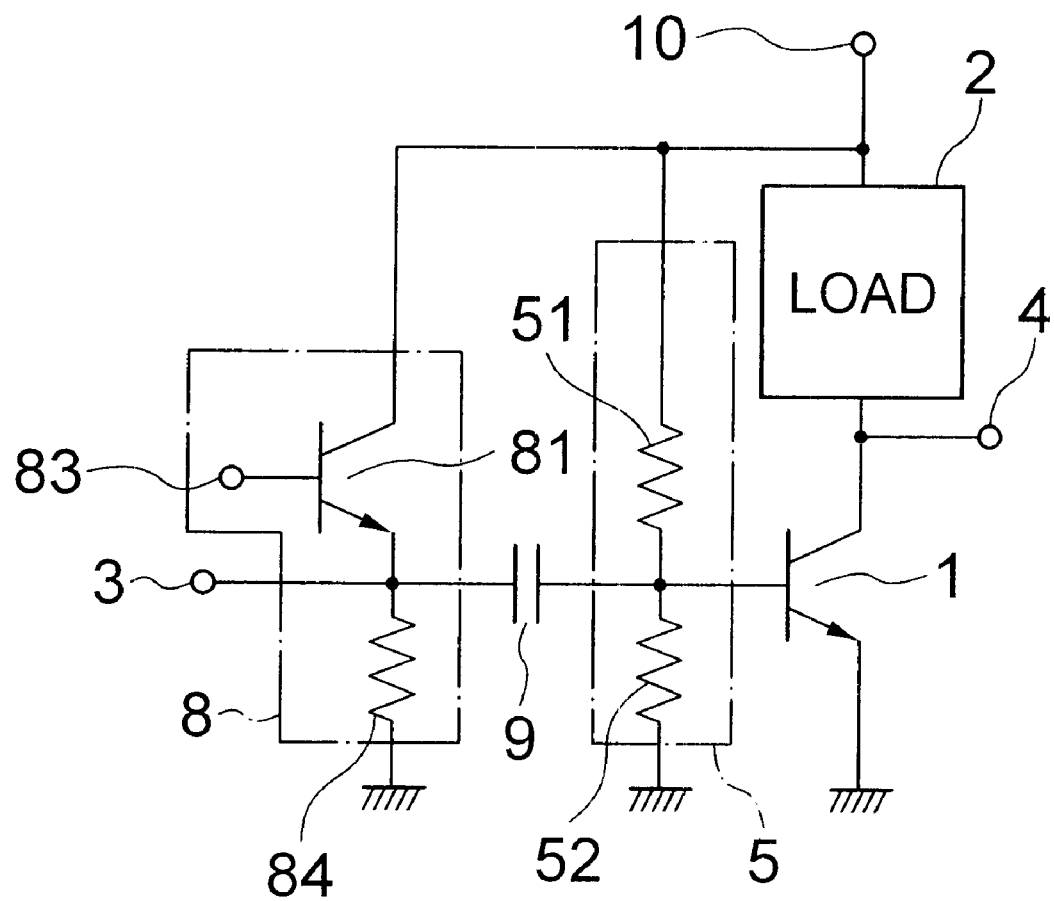
FIG. 3 is a circuit diagram of another conventional variable-gain circuit.
Figure 4:
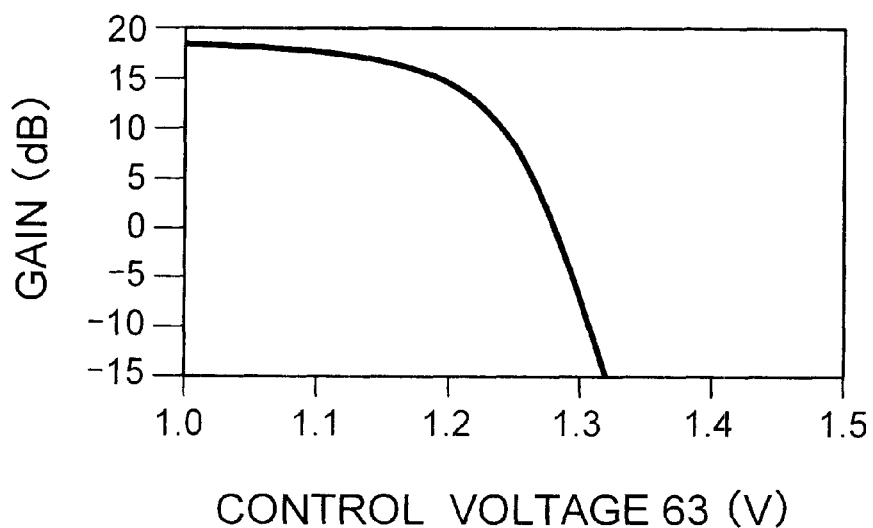
FIG. 4 is a graph showing a gain curve of the variable-gain circuit of FIG. 2.
Figure 5:
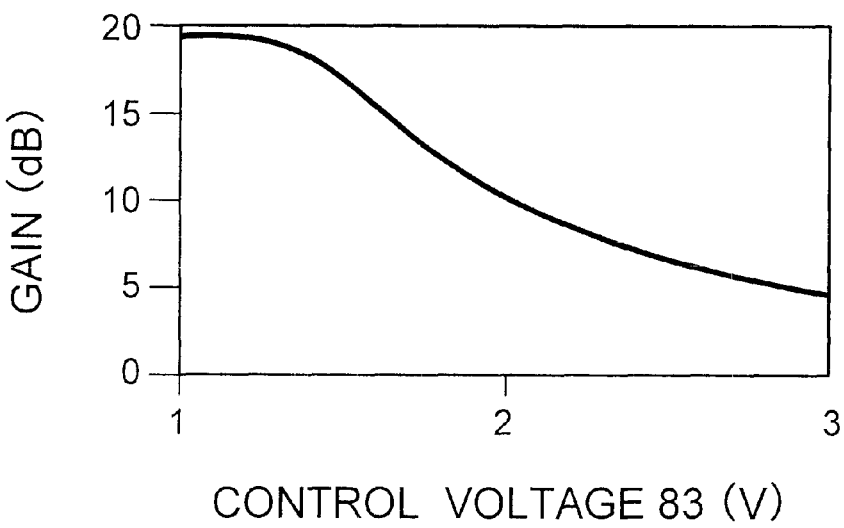
FIG. 5 is a graph showing a gain curve of the variable-gain circuit of FIG. 3.

Now, the present invention is more specifically described with reference to accompanying drawings, wherein similar constituent elements are designated by similar reference numerals throughout the drawings.

Figure 6:
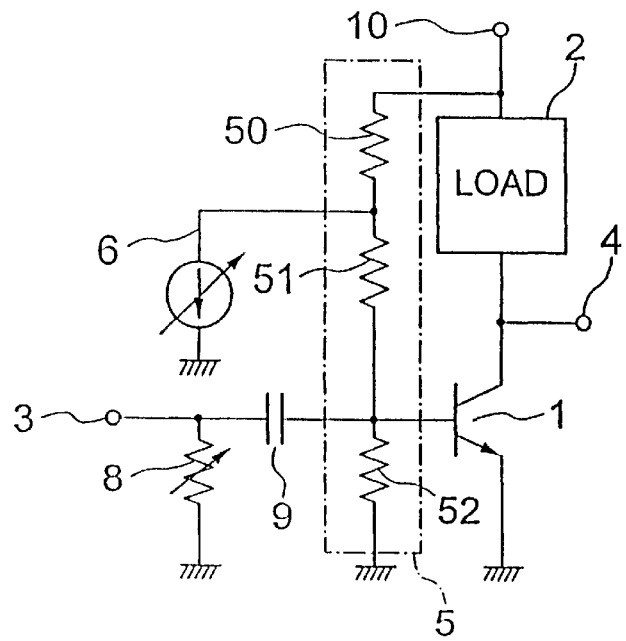
FIG. 6 is a circuit diagram of a variable-gain circuit according to a first embodiment of the present invention.

Referring to FIG. 6, a variable-gain circuit according to a first embodiment of the present invention includes a common emitter transistor (functional circuit) 1 having a collector connected to a power supply source 10 via a load 2, through which the amplified output signal 4 is fed. The base of transistor 1 is connected to a base bias circuit 5 including bias resistors 50, 51 and 52 connected in series between the power supply source 10 and the ground. A variable current source (gain control section) 6 is connected to a node which connects resistors 50 and 51 together. The base of transistor 1 is also connected to a variable-impedance circuit (gain control section) 8 via a DC-blocking capacitor 9.

Figure 7:
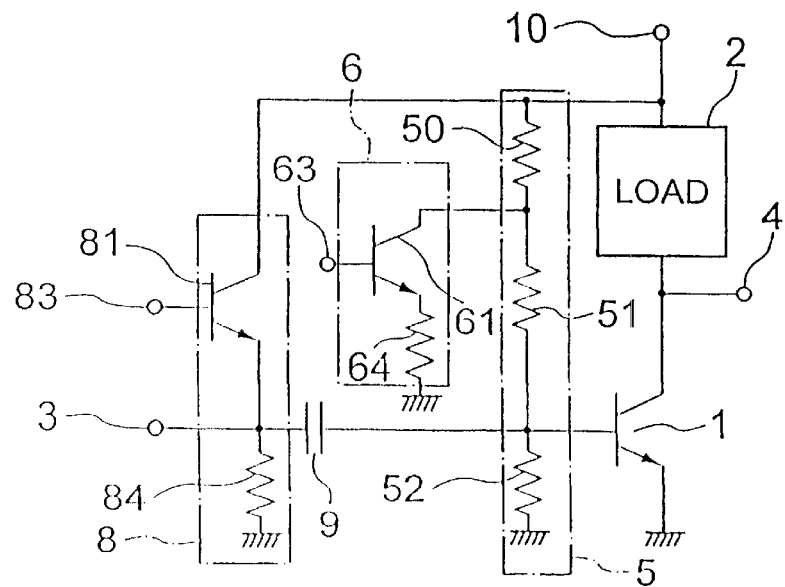
FIG. 7 is a circuit diagram of a practical example of the variable-gain circuit of FIG. 6.

Referring to FIG. 7, practical circuits for the variable current source 6 and the variable-impedance circuit 8 in the present embodiment are exemplified, each of the circuits 6 and 8 including a transistor and a resistor. The present embodiment will be described below with reference to the configuration of FIG. 7.

Both the control signals for the variable current source 6 and the variable-impedance circuit 8 are fed from a control unit (not shown) for a single input signal input to transistor 1 to obtain an output signal therefrom which follows a substantially linear gain curve.

The variable current source 6, which controls the base bias current of transistor 1 for a variable gain, includes a current source transistor 61 and a resistor 64. The input voltage for the base 63 of transistor 61 is controlled to vary the collector current of transistor 61 corresponding to the base input voltage, whereby the base bias voltage of transistor 1 is controlled.

Increase of voltage for the current source control terminal 63 raises the current of variable current source transistor 61, thereby increasing the shunt current of the base bias supply current shunted toward the current source 6. Thus, the base bias supplied to transistor 1 is reduced to reduce the gain. On the other hand, decrease of voltage for the current source control terminal 63 lowers the shunt current of the base bias current, thereby increasing the base bias for transistor 1 to increase the gain.

The variable-impedance circuit 8, which bypasses the input signal to vary the gain of transistor 1, includes a common base transistor 81 and a resistor 84. The base 83 of transistor 81 is grounded in terms of AC sense. By varying the voltage for the control terminal (variable-impedance control terminal) of transistor 81, the emitter-ground input impedance of transistor 81 is varied, whereby the shunt current of the input signal is controlled.

More specifically, increase of voltage for the variable-impedance control terminal 83 lowers the input impedance of the variable-impedance transistor 81. As a result, the shunt current of the input signal shunted toward the variable-impedance circuit 8, thereby reducing the base input of transistor 1 to reduce the gain thereof. On the other hand, decrease of voltage for the variable-impedance control terminal 83 raises the input impedance of the variable-impedance transistor 81. As a result, the shunt current of the input signal is reduced, thereby increasing the base input of transistor 1 to increase the gain.

Figure 8:
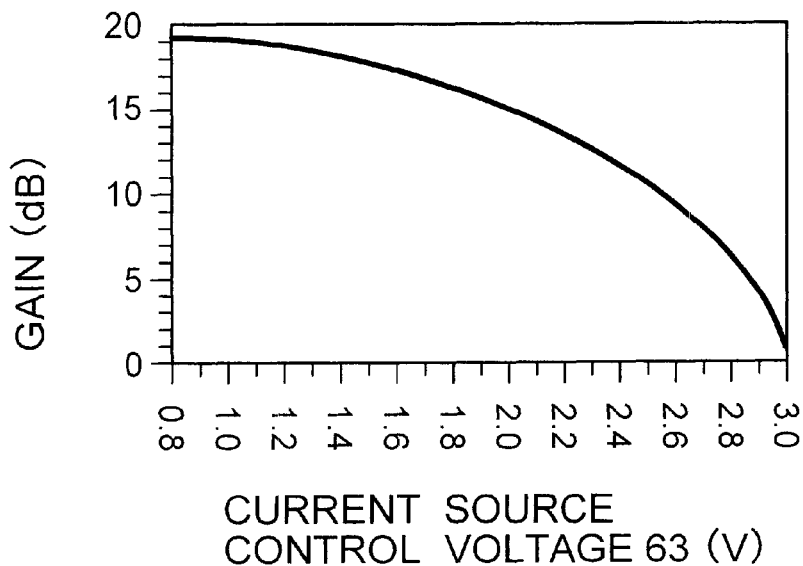
FIG. 8 shows a gain curve of decibel gain obtained by the variable current source shown in FIG. 7.
Figure 9:
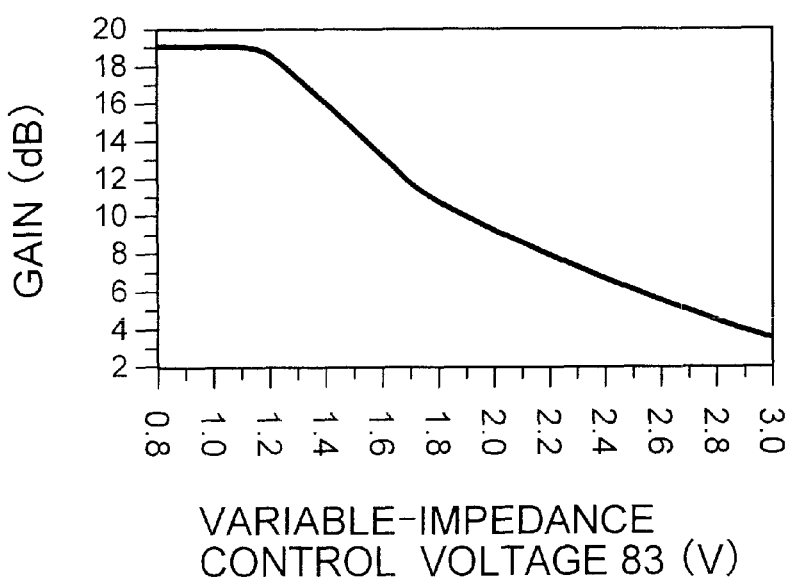
FIG. 9 shows the gain curve of decibel gain obtained by the variable-impedance circuit shown in FIG. 7.

Referring to FIG. 8, a gain curve is obtained by plotting the decibel gain against the voltage for the variable current source control terminal 63, with the voltage for the variable-impedance control terminal 83 being fixed As understood from FIG. 8, increase of the control voltage raises the reduction rate of the gain, whereby the gain curve is convex toward the top. Referring to FIG. 9, another gain curve is obtained by plotting the decibel gain against the voltage for the variable-impedance control terminal 83, with the voltage for the variable current source control terminal 63 being fixed. As understood from FIG. 9, increase of the control voltage lowers the reduction rate of the gain and eventually saturates the same, whereby the gain curve is convex toward the bottom.

Figure 10:
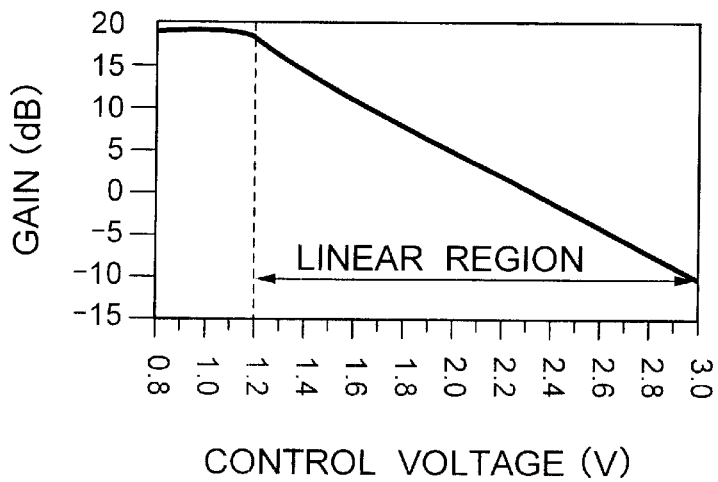
FIG. 10 shows an overall gain curve obtained by the variable-gain circuit shown in FIG. 7.

If the bias resistor 50 has a higher resistance and the voltages for both the variable-impedance control terminal 83 and the variable current control terminal 63 are controlled at the same time, the gain control by the variable current source 6 dominates, whereby the overall gain curve becomes convex toward the top. On the other hand, if the bias resistor 50 has a lower resistance, the gain control by the variable-impedance circuit 8 dominates in the similar situation, whereby the overall gain curve becomes convex toward the bottom. By setting the resistance of the bias resistor 50 at a suitable value, a substantially linear gain curve such as shown in FIG. 10 can be obtained due to the cancellation of the gain curves by each other.

The detail of the cancellation function in the variable-gain circuit of the present embodiment will be described in connection with the variable-impedance circuit 8 and the variable current source 6 in FIG. 7.

Figure 11:
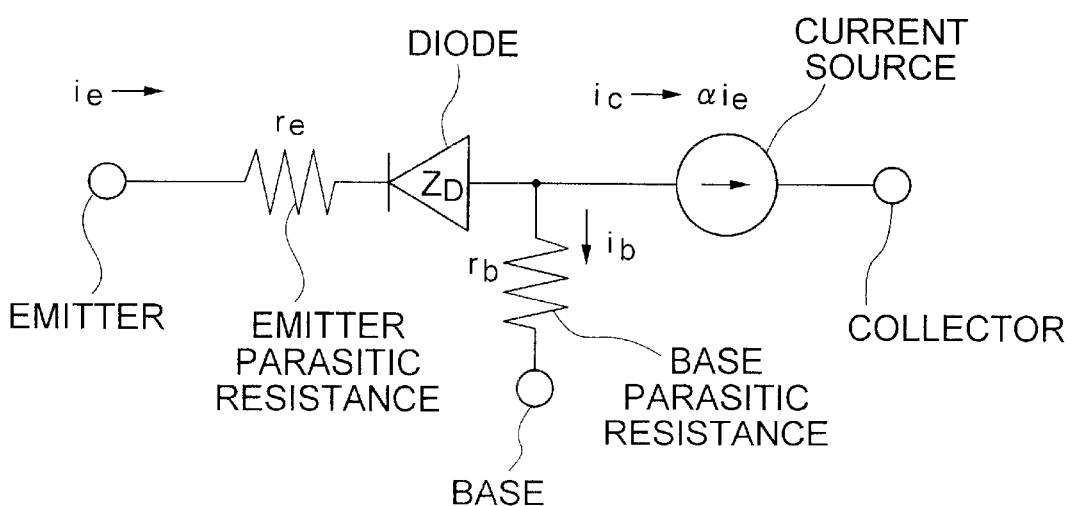
FIG. 11 is an equivalent circuit diagram of a typical bipolar transistor.

FIG. 11 shows the equivalent circuit of transistor 81 in the variable-impedance circuit 8 in terms of AC sense. Assuming that emitter parasitic resistance, base parasitic resistance, base-to-emitter diode impedance and transport factor of transistor 81 are represented by $r_e$, $r_b$, $Z_D$ and $\alpha$, the impedance Zi as viewed from the emitter of transistor 81 used as the variable impedance is expressed by the following formula:

$$Zi = \frac{v1}{i_e}$$

wherein
$v1 = (r_e + Z_D) \cdot i_e + r_b \cdot i_b$, and
$i_b = i_e - i_c = (1-\alpha) \cdot i_b$
hold in the transistor.
Thus, the impedance Zi is expressed by;

$$Zi = r_e + Z_D + (1-\alpha) \cdot r_b. \quad (1)$$

The diode impedance $Z_D$ can be also expressed in terms of differential conductance $g_D$ and capacitance Cj by the following formula;

$$1/Z_D = g_D + j\omega Cj.$$

If the diffusion capacitance of transistor is significantly smaller compared to the junction capacitance, $g_D$ and Cj are expressed by the following formulas:

$$g_D = \frac{q}{kT} \cdot I_F = g_o\{\exp(a_o V_D) - 1\}(V_D > 0)$$

$$C_j = \left(\frac{c}{\phi_D - V_D}\right)^{\frac{1}{n}}(V_D < \phi_D)$$

wherein q, k, T and IF are charge of electron, Boltzman constant, absolute temperature and forward DC current of diode, $g_0$, $a_0$ and C are constants, $\Phi_D$ is the self contained potential and n is a constant generally residing between 2 and 3. $V_D$ is a forward voltage applied across the diode.

Figure 12:
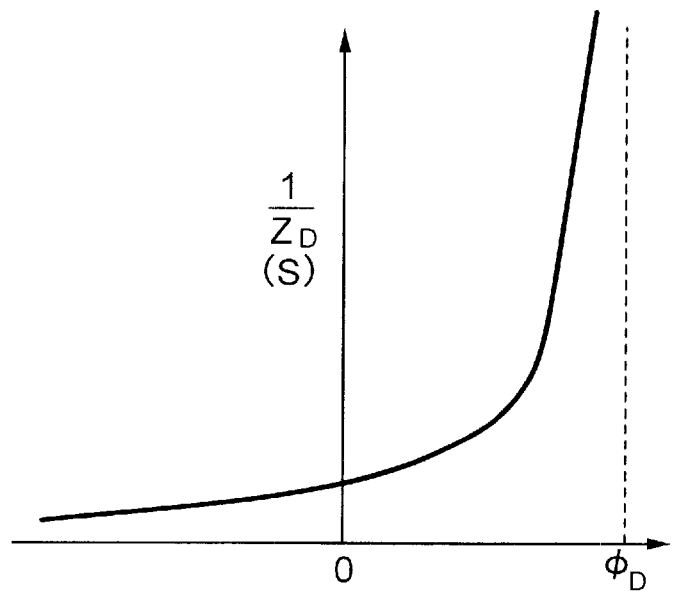
FIG. 12 shows a bias dependency of the base-emitter admittance of a typical bipolar transistor.
Figure 13:
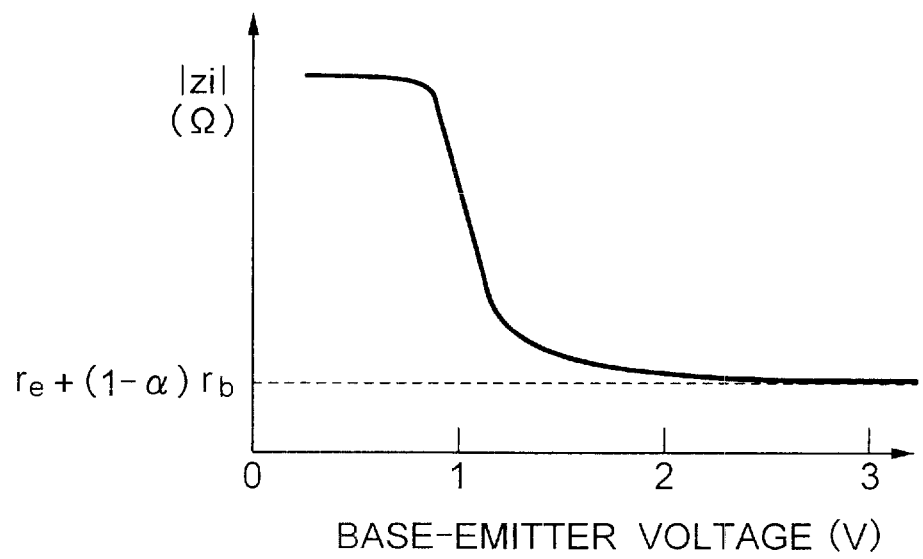
FIG. 13 shows a bias dependency of the input impedance of a common base transistor.

The differential conductance $g_D$ assumes zero if the base-to-emitter voltage is negative, and increases in proportion to the forward current if the base-to-emitter is positive. The capacitance Cj resides within the depletion layer between the base and the emitter, and assumes infinity due to distinction of the depletion layer if the forward voltage $V_D$ reaches the self contained potential $\Phi_D$. As a result, the reciprocal (1/$Z_D$) of the diode impedance and the base-to-emitter voltage Vbe have the above relationship therebetween, such as shown in FIG. 12. The absolute value of the input impedance Zi of the variable impedance reduces rapidly with the increase of the base-to-emitter voltage Vbe in the lower range of Vbe and saturates at a voltage of:

$$r_e + (1-\alpha)r_b.$$

The decibel gain Ga of the transistor amplifier is expressed in terms of electric power Pin supplied to the transistor amplifier, electric power P supplied to transistor 1 and a constant $Ga_{max}$ by the following equation:

$$Ga = Ga_{max} + 10 \log\left(\frac{Pt}{Pin}\right)$$

The admittance Yi of the variable impedance Zi is here defined by:

$$Yi = 1/Zi,$$

and the input admittance of the amplifying transistor 1 is defined by:

$$Y = G + jB.$$

Figure 14:
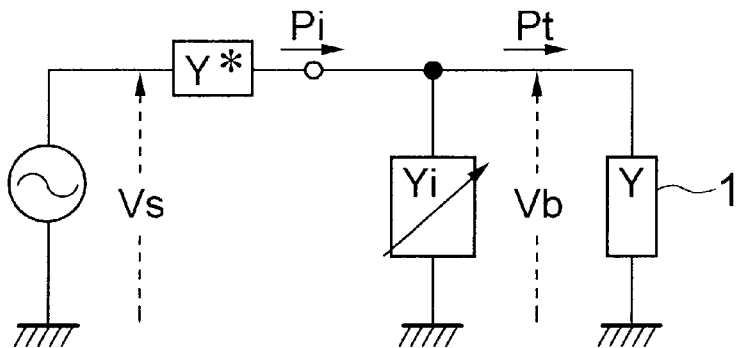
FIG. 14 is an equivalent circuit diagram showing the variable-impedance circuit shown in FIG. 7.

If the admittance of the matching circuit and the signal source as viewed from the input terminal is defined by:

$$Y^* = G - jB,$$

the resultant AC equivalent circuit is shown in FIG. 14. The electric power Pt supplied to amplifying transistor 1 is expressed by:

$$Pt = G|v_b|^2$$

Here, $v_b$ and $v_s$ in FIG. 8 have therebetween the following relationship:

$$v_b = \frac{Y^*}{Yi + Y + Y^*} v_s$$

G and B are substituted for above relationship to obtain the following relationship:

$$v_b = \frac{G - jB}{2G + Yi} v_s$$

From the above relationships, the relationship between the decibel gain Ga and the base-emitter diode voltage $V_D$ is obtained as follows:

$$Ga = Ga_{max} + 10\log\left(\frac{G}{Pin} \cdot \left|\frac{G + jB}{2G + Yi} \cdot v_s\right|^2\right)$$

$$= Ga_{max} + 10\log\frac{G}{Pin} +$$

$$20\log|(G + jB) \cdot v_s| - 20\log|2G + Yi|.$$

By substituting equation (1) for the above formula, and replacing the term which does not depend on the change of Yi by $Ga_0$, the following equation:

$$Ga = Ga_0 - 20\log|2G + (r_e + Z_D + (1-\alpha) \cdot r_b)^{-1}|$$

is obtained.

The above equation can be modified in the range where $V_D$ is significantly lower and $Z_D >> r_e + (1-\alpha)r_b$ as follows:

$$Ga = Ga_0 - 20\log\left|2G + g_0\{\exp(aV_D) - 1\} + \left(\frac{c}{\phi_D - V_D}\right)^{\frac{1}{n}}\right|.$$

The above formula assumes roughly a constant:

$$Ga_0 - 20\log(2G)$$

in the range where:

$$2G \gg g_0\{\exp(aV_D) - 1\} + \left(\frac{c}{\phi_D - V_D}\right)^{\frac{1}{n}} \quad (2)$$

and reduces where $$2G \leq g_0\{\exp(aV_D) - 1\} + \left(\frac{c}{\phi_D - V_d}\right)^{\frac{1}{n}} \quad (3)$$

In the range where $V_D$ approaches $\Phi_D$, the following relationship:

$$ZD \ll r_e + (1-\alpha)r_b \quad (4)$$

holds, and Ga is asymptotic to a constant where:

$$Ga = Ga_0 - 20\log|2G + \{r_c + (1-\alpha) \cdot r_b\}^{-1}|$$

Figure 15:
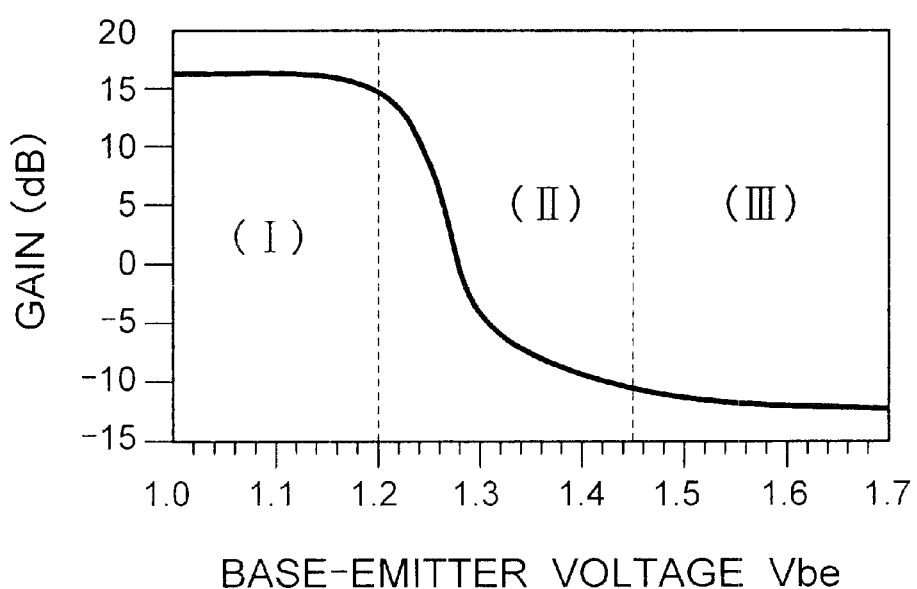
FIG. 15 is a graph showing the gain control by the variable-impedance circuit shown in FIG. 7.

Thus, the gain curve obtained by the gain control using the variable impedance is such that shown in FIG. 15.

In FIG. 15, "Range I" indicates the range where relationship (2) holds, "Range II" indicates the range where relationship (3) holds, and "Range III" indicates the range where the relationship (4) holds. In the area near the boundary between the Range II and Range III, the gain reduces with the reduction of Zi and eventually saturates, whereby the gain curve is convex toward the bottom. The variable range of Ga with respect to the control voltage $V_{ct1}$ can be controlled by adjusting the resistance of the emitter resistor 84 of transistor 81 to control the divided ratio of the emitter-to-base voltage Vbe with respect to the control voltage $V_{ct1}$.

The variable current source in the present embodiment also controls the gain as detailed below.

Figure 16:
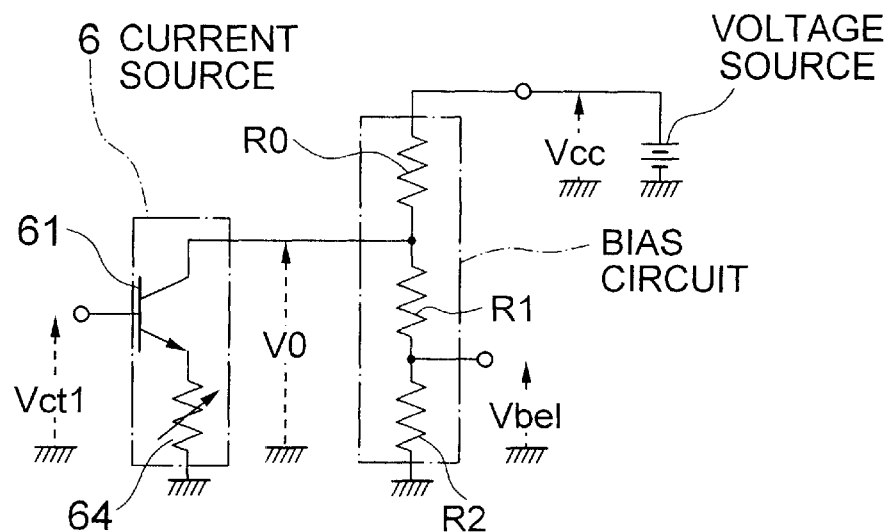
FIG. 16 is a circuit diagram for showing the function of the variable current source shown in FIG. 7

FIG. 16 shows circuit configuration including the variable current source having transistor 61 and resistor 64, the base bias circuit having resistors having resistances R0, R1 and R2, and the voltage source generating voltage $V_{CC}$. Since the gain of a transistor is generally proportional to the exponential function of the base bias voltage of the transistor, the decibel gain Ga can be expressed in terms of the base bias voltage $V_{be1}$ and a constant A as follows:

$$Ga = A \cdot V_{be1}.$$

The base bias voltage $V_{be1}$ generated by the base bias circuit and the voltage $V_0$ applied across the variable current source have therebetween the following relationship:

$$V_{be1} = V_0 \cdot \frac{R2}{R1 + R2}.$$

In addition, the voltage $V_0$ and the current $I_C$ flowing into the variable current source have therebetween the following relationship:

$$V_0 = V_{CC} - R_0 \cdot I_C.$$

Further, $I_C$ can be expressed in terms of the control voltage $V_{ct1}$ for the current source and constants Ig and a1 as follows:

$$I_C = I_g \cdot \{\exp(a_1 V_{ct1}) 1\}.$$

Thus, the relationship between the decibel gain Ga and the variable current source control voltage $V_{ct1}$ can be expressed as follows:

$$Ga = A \cdot \frac{R2}{R1 + R2}\{V_{CC} - R_0 \cdot I_g \cdot \{\exp(a_1 V_{cll}) - 1\}\}. \quad (5)$$

Figure 17:
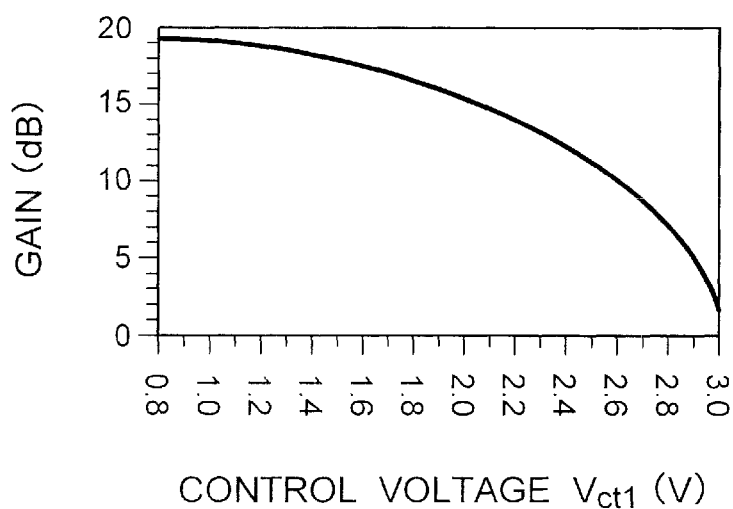
FIG. 17 shows the gain curve of decibel gain obtained by the variable current circuit shown in FIG. 16.

Thus, the decibel gain Ga reduces exponentially with the increase of control voltage $V_{ct1}$ for the current source, as shown in FIG. 17, wherein the gain curve is convex toward the top. The variable range of the decibel gain Ga with respect to the control voltage $V_{ct1}$ is controlled by adjusting the constant $I_g$ and the resistance $R_0$.

As detailed above, the gain curve obtained by the variable impedance using the change of AC impedance between the base and emitter is convex toward the bottom, whereas the gain curve obtained by the variable current source connected between the base bias circuit and the reference voltage is convex toward the top. By superposing the gain curves which are convex toward the bottom and the top, the non-linearity characteristics of both the gain curves cancel each other. Although it is most preferable that both the non-linearity characteristics be completely cancelled by each other using the gain curves having the same variable range of the gain with respect to the control voltage to obtain a substantially linear property of the final gain curve, it is sufficient in the present invention to improve the non-linearity in the final gain curve to some extent even by using different variable ranges of the gain.

In the other embodiments to follow, similar operational principle is employed wherein the gain curves which are convex toward the top and toward the bottom cancel each other.

Figure 18:
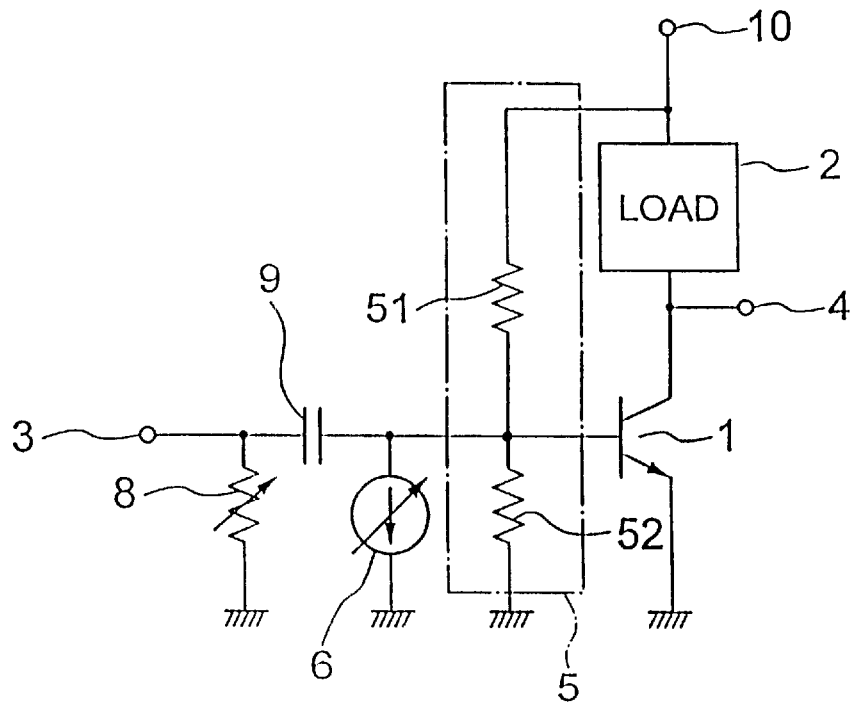
FIG. 18 is a circuit diagram of a variable-gain circuit according to a second embodiment of the present invention.

Referring to FIG. 18, a variable-gain circuit according to a second embodiment of the present invention is similar to the first embodiment except that the variable current source 6 is connected between the base of transistor 1 and the ground in the present invention. The operation itself of the variable-gain circuit is similar to that shown in FIG. 6.

Figure 19:
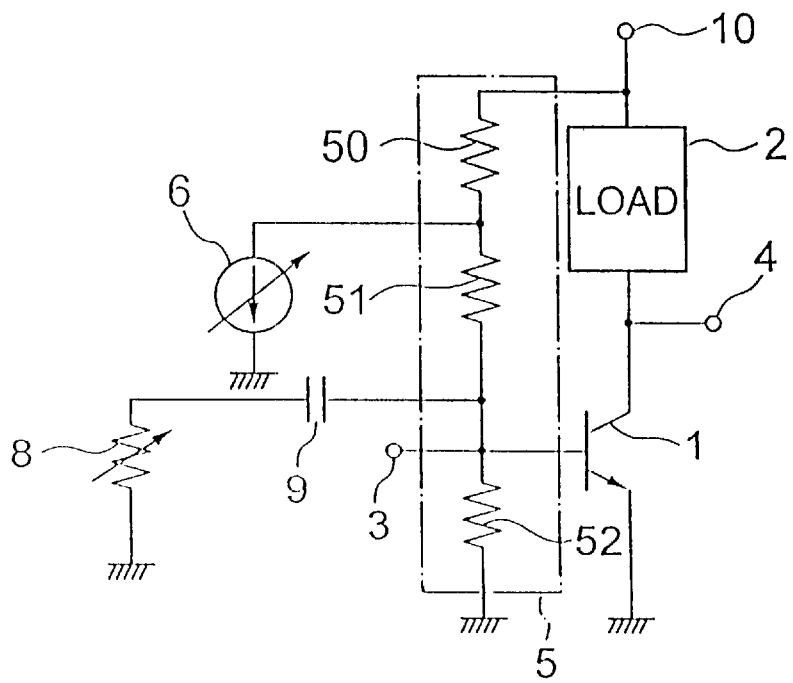
FIG. 19 is a circuit diagram of a variable-gain circuit according to a third embodiment of the present invention.
Figure 20:
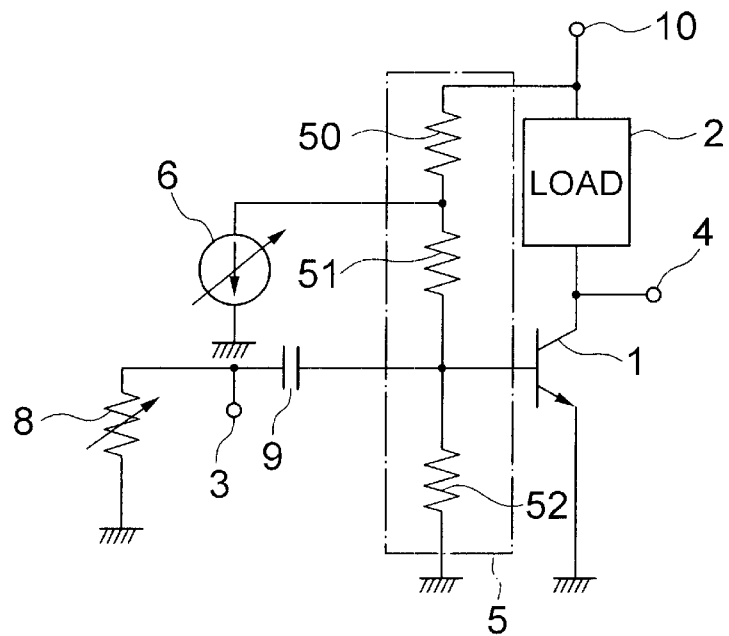
FIG. 20 is a circuit diagram of a variable-gain circuit according to a fourth embodiment of the present invention.

Referring to FIGS. 19 and 20, variable-gain circuits according to third and fourth embodiments of the present invention are similar to the first embodiment except that each of the variable-impedance circuits in the third and fourth embodiments is connected in parallel to the base of the amplifying transistor 1. In the variable-gain circuits of FIGS. 6, 19 and 20, there are some differences in the connection for input terminal 3, variable-impedance circuit 8 and DC-block capacitor 9. Similar operations can be obtained in these circuits.

Figure 21:
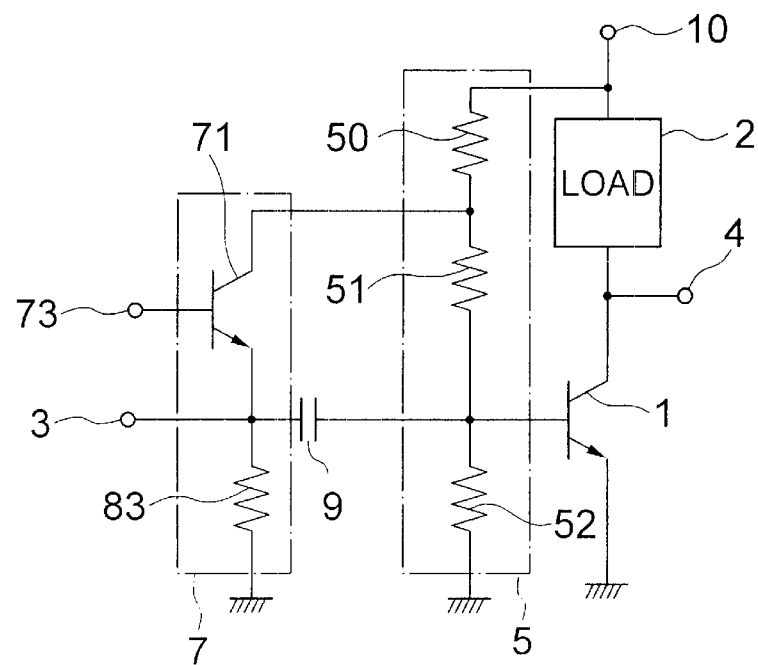
FIG. 21 is a circuit diagram of a variable-gain circuit according to a fifth embodiment of the present invention.

Referring to FIG. 21, a variable-gain circuit according to a fifth embodiment of the present invention is such that the variable current source and the variable-impedance circuit can be unified in a single hybrid circuit 7. The hybrid circuit 7 includes a transistor 71 and a resistor 83. By controlling the voltage for the base 73 of transistor 71, the collector current of transistor 1 can be controlled. By controlling the control terminal 3 for the emitter of transistor 71 with the base 73 being grounded in terms of AC sense, the input impedance as viewed from the emitter can be changed.

Figure 22:
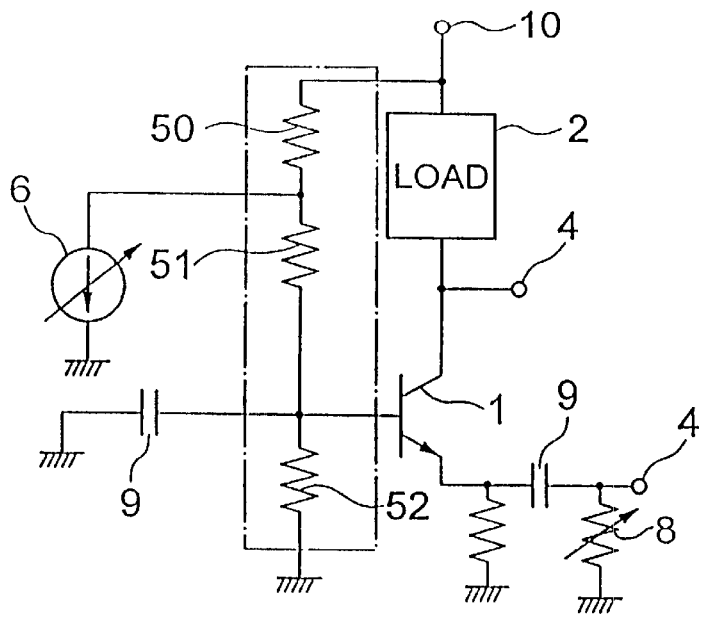
FIG. 22 is a circuit diagram of a variable-gain circuit modified from one of the embodiments.
Figure 23:
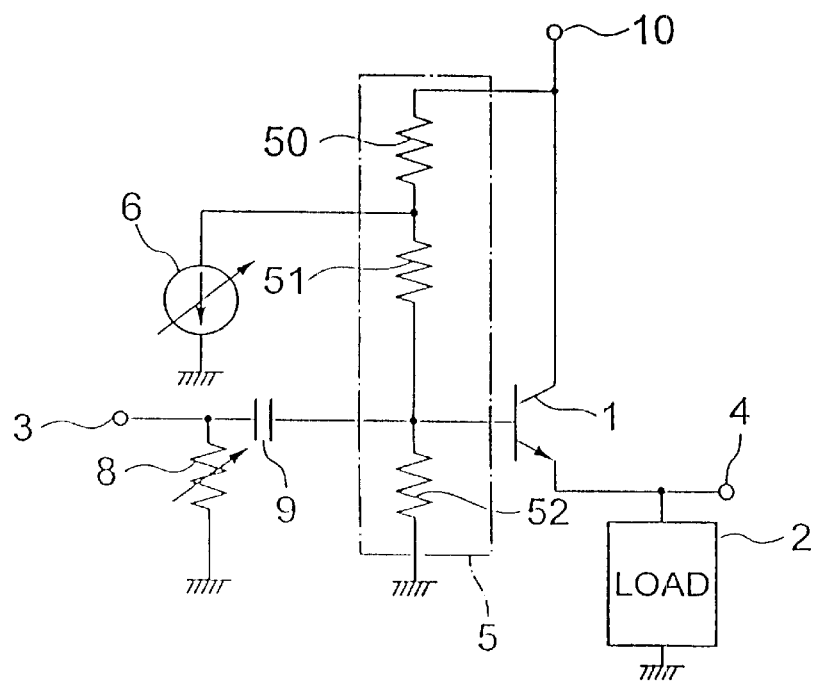
FIG. 23 is a circuit diagram of a variable-gain circuit modified from one of the embodiments.
Figure 24:
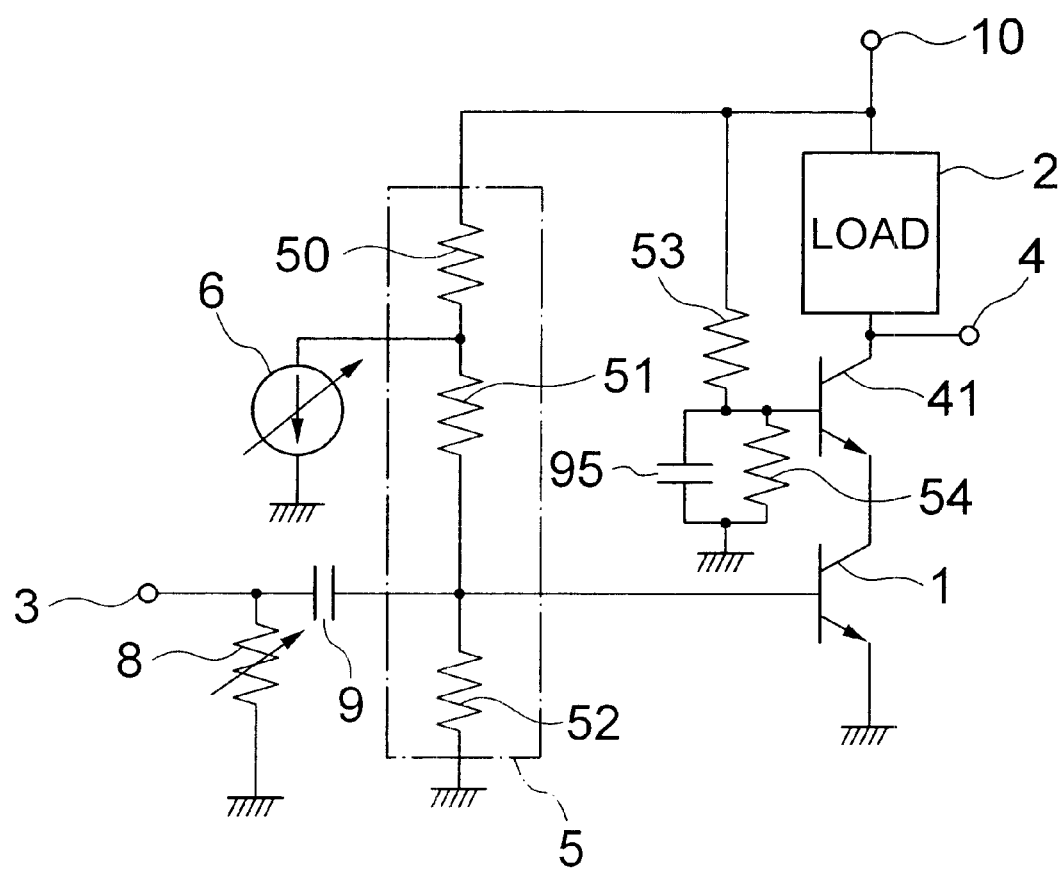
FIG. 24 is a circuit diagram of a variable-gain circuit modified from one of the embodiments.

The variable-gain circuits in the first through fifth embodiments can be applied to any of the configurations shown in FIGS. 22, 23 and 24. The variable-gain circuits of FIGS. 22, 23 and 24 have a common base connection, a common collector connection and a cascode connection, respectively. In FIG. 22, the variable-impedance circuit 8 is connected to the emitter of transistor 1 via a DC-blocking capacitor 9, and the input terminal 3 is connected to the emitter of transistor 1. In FIG. 23, the output signal is applied to the load 2 via the output terminal 4 connected to the emitter of transistor 1.

Now, the present invention is further described with reference to practical examples of the present invention. In each of the practical examples, each of transistors used therein is a GaAs-HBT (heterojunction bipolar transistor) having excellent performance in a high-frequency range. In addition, the power supply terminal 10 is applied with a DC 3.0 volts from a DC voltage source 12, the load 2 is an inductor having 68 nH (nano-henry), and the output signal is fed from the output terminal 4 via a 1 μF DC-blocking capacitor, a matching circuit 14 and a matched terminal 44. The base of transistor 1 is biased with bias resistors 50, 51 and 52 so that the collector current thereof assumes 5 mA. The input signal 33 is fed to the input terminal 3 via a matching Circuit 14 and a DC-blocking capacitor 93 having a capacitance of 1 μF.

EXAMPLE 1

Figure 25:
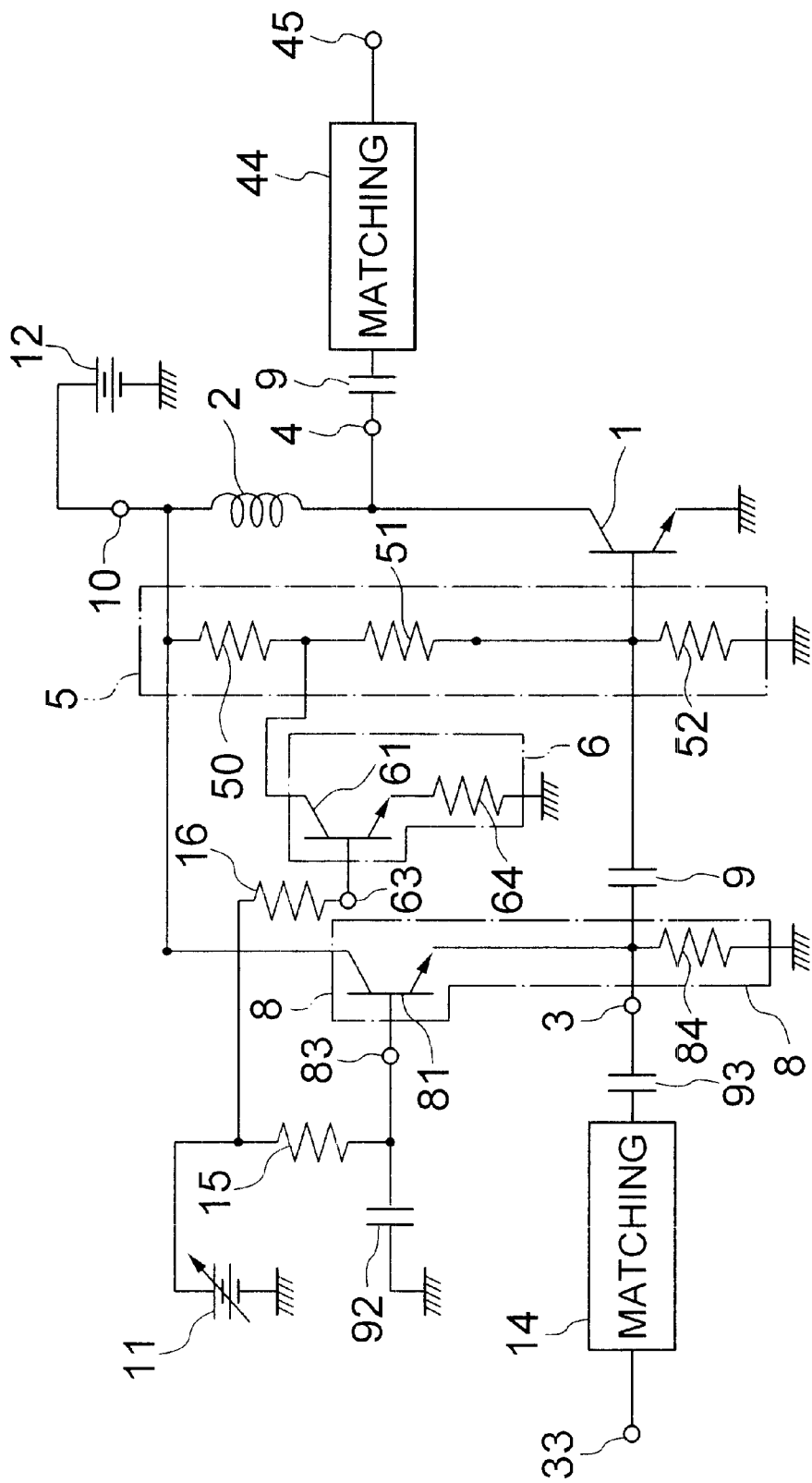
FIG. 25 is a circuit diagram of a practical example 1 of the variable-gain of the present invention.

Referring to FIG. 25, the present example is configured based on the first embodiment of FIG. 6. The variable circuit 8 includes a common base transistor 81 and a serial resistor 84 having a resistance of 300 Ω, and is connected to the base of transistor 1 via the DC-blocking capacitor 9. The variable-impedance control terminal 83 is connected to the ground via a DC-blocking capacitor 92, and to the control voltage generator 11 via a resistor 15 of 5 kΩ.

The variable current source 6 includes a current source transistor 61, and a serial resistor 64, and is connected between the base bias circuit 5 for transistor 1 and the ground. The variable current source control terminal 63 is connected to the control voltage generator 11 via a resistor 16 of 5 kΩ.

In the present example, selected resistors are such that resistor 64 in the variable current source is of 300 Ω, resistor 84 in variable-impedance circuit 8 is of 300 Ω, and the dividing resistor 50 in the base bias circuit is of 100 Ω. The gain curve of the present example was measured while feeding an input signal 33 having a frequency of 2 GHz and an electric power of 1 μW. The results of measurement are shown in FIG. 10, wherein the resultant gain curve had an approximate linear region in a range of the control voltage over 1.2 volts.

Figure 26:
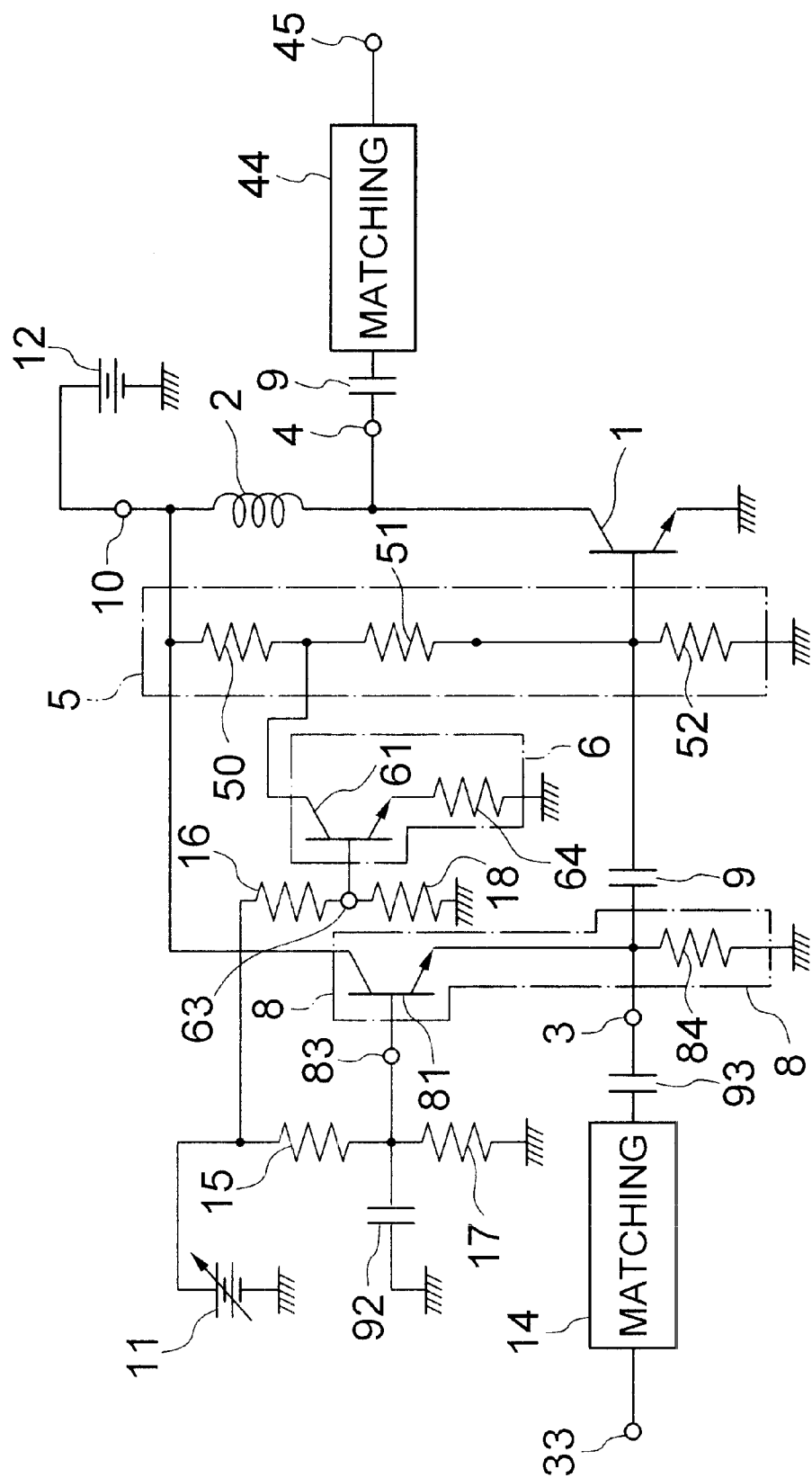
FIG. 26 is a circuit diagram of a practical example 2 of the variable-gain of the present invention.

In the present example, the control voltage generator 11 is connected via resistors 15 and 16 to the variable-gain circuit. In this configuration, both the control voltages for the variable impedance and the variable current source can be controlled separately provided that, as shown in FIG. 26, resistors 17 and 18 are connected between the variable-impedance control terminal 83 and the ground and between the variable current source control terminal 63 and the ground, respectively, for dividing the control voltages.

EXAMPLE 2

Figure 27:
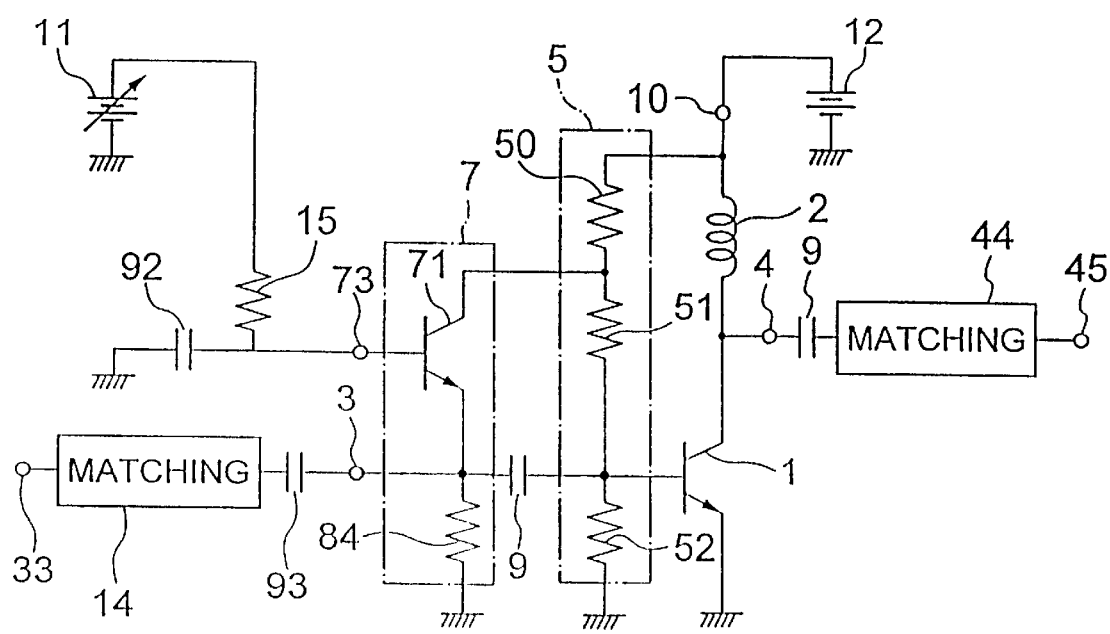
FIG. 27 is a circuit diagram of a modification from FIG. 26.

Referring to FIG. 27, the present example is configured based on the embodiment of FIG. 21. The hybrid circuit 7 includes a common base transistor 71 and a 300 Ω serial resistor 84, and is connected to the base of transistor 1 via a 1 μFDC-blocking capacitor 9. The control terminal 73 is connected to the ground via a 1 μF DC-blocking capacitor 92, and to the control voltage generator 11 via a 5 kΩ resistor 15.

In the present example, a gain curve similar to that of FIG. 10 was obtained from an input signal 33 having a frequency of 2 GHz and a power of 1 μW for the configuration wherein the selected dividing resistor 50 had a resistance of 100 Ω.

Figure 28:
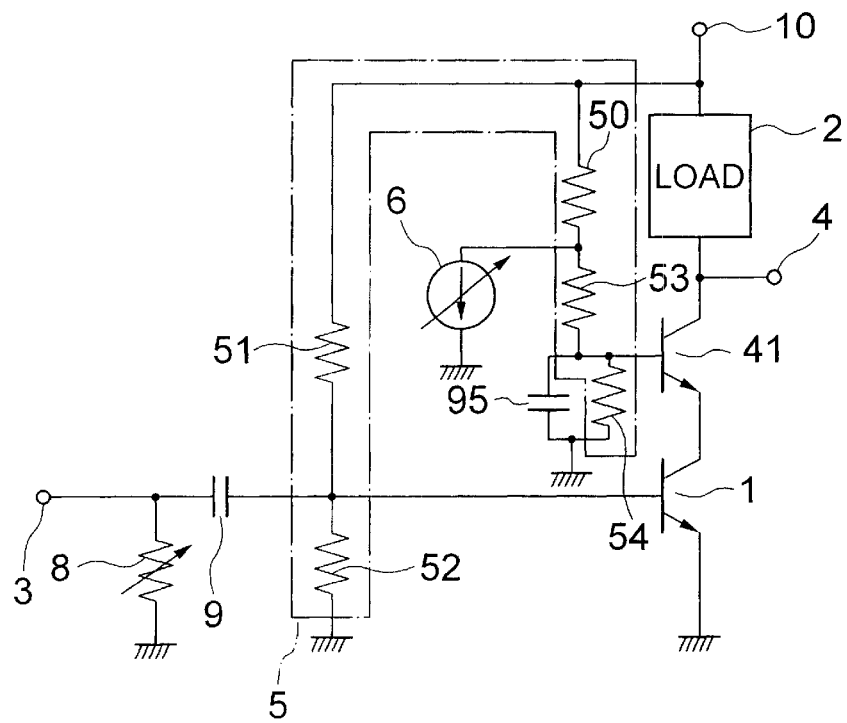
FIG. 28 is a circuit diagram of a practical example 3 of the variable-gain of the present invention.

Referring to FIG. 28, the present example is configured based on the variable-gain circuit of FIG. 24. More specifically, the collector of transistor 1 is connected to the emitter of a common base transistor 41 to obtain a cascode connection. The base of transistor 41 is connected to the ground via a DC-blocking capacitor 95 and biased by resistors 50, 53 and 54. The base bias of the common base transistor 41 is controlled by the variable current source 6 while the shunt current of the input signal is controlled by a variable resistor 8. This example exhibited a substantially linear gain curve similar to that of FIG. 10.

Figure 29:
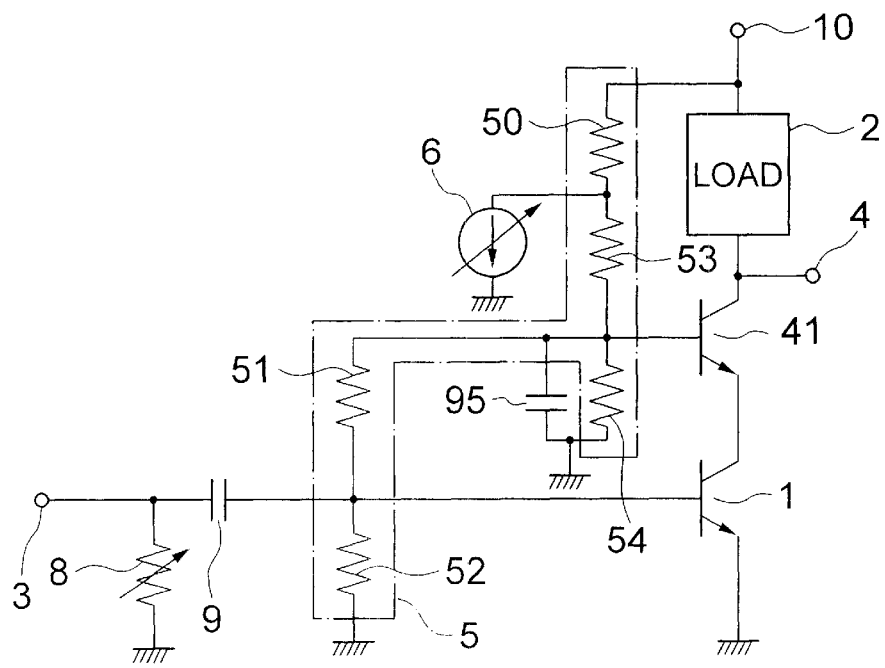
FIG. 29 is a circuit diagram of a modification from FIG. 28.

Referring to FIG. 29, another example of cascode connection modified from FIG. 28 is such that the base bias of transistor 1 is obtained by connecting the base of transistor 1 between the base of transistor 41 and the ground, whereby the base bias currents for both transistors 1 and 41 are controlled by the variable current source 6. A similar function can be obtained. In another alternative, the bias current of transistor 1 may be controlled by the variable current source 6 similarly to FIG. 24.

EXAMPLE 4

Figure 30:
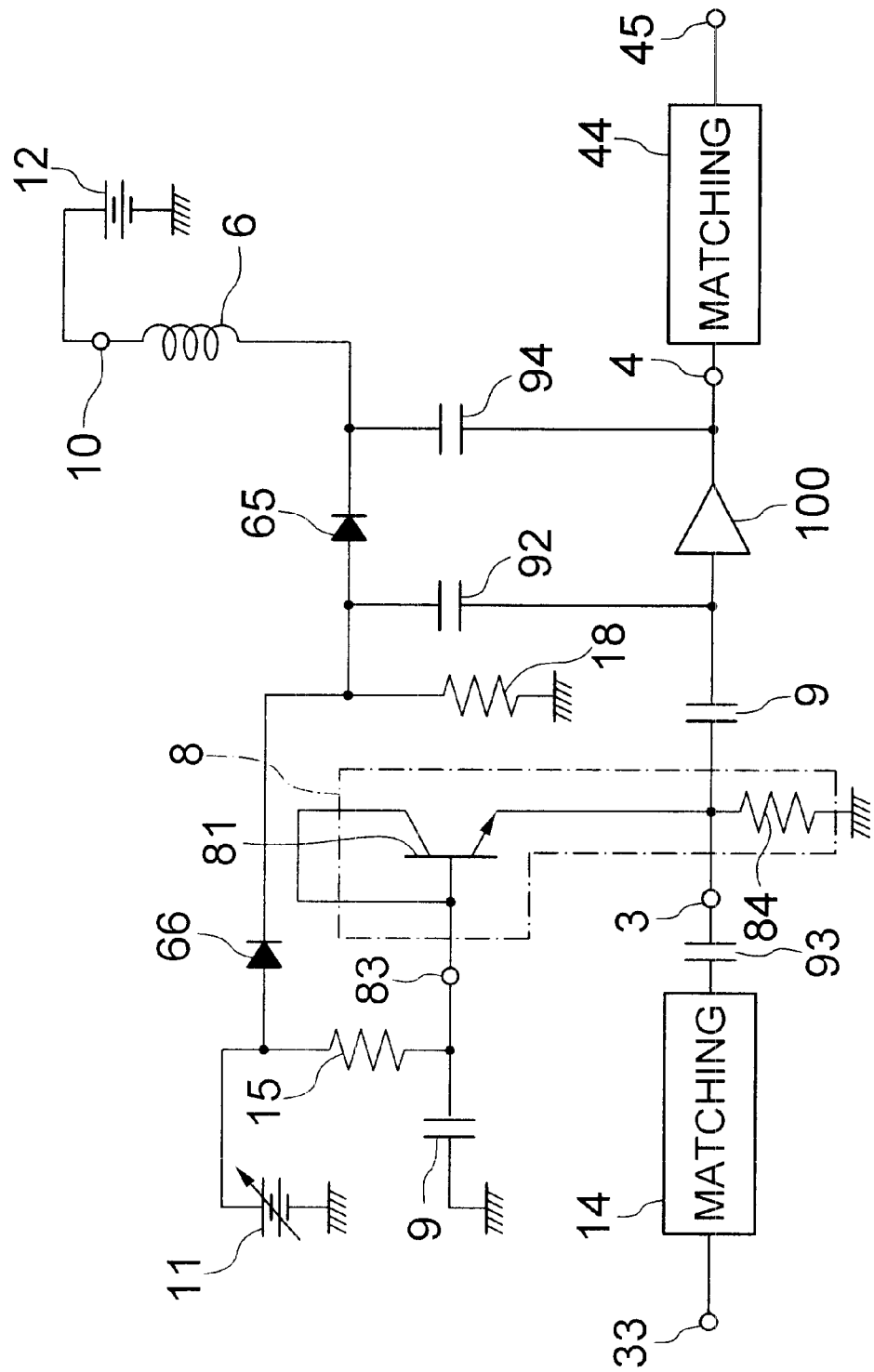
FIG. 30 is a circuit diagram of a practical example 4 of the variable-gain of the present invention.

Referring to FIG. 30, the gain control scheme for obtaining a gain curve which is convex toward the top is achieved by a configuration wherein a variable-capacitance diode 5 is connected between the input and the output of amplifier 100 via a capacitor. The gain control scheme for obtaining a gain curve which is convex toward the bottom is obtained by the variable-impedance circuit 8 as in the cases of the precedent examples. A DC current source 12 is connected to the cathode of diode 65 via an inductor 6, and the anode of diode 65 is connected to the ground via a resistor 18 and to the variable voltage generator 11 via a rectifying diode 66.

The reverse bias voltage applied to the variable-capacitance diode 65 is controlled to adjust the feed-back amount from the output to the input of the amplifier 100, whereby the gain of the overall circuit is controlled. The rectifying diode 66 and resistor 18 control the reverse bias voltage applied across diode 65 by dividing the output from the control voltage generator 11. Thus, by controlling the feed-back amount and controlling the shunt current of the input signal by using the variable impedance circuit 8, a substantially linear gain curve similar to that of FIG. 10 can be obtained in the present example.

EXAMPLE 5

Figure 31:
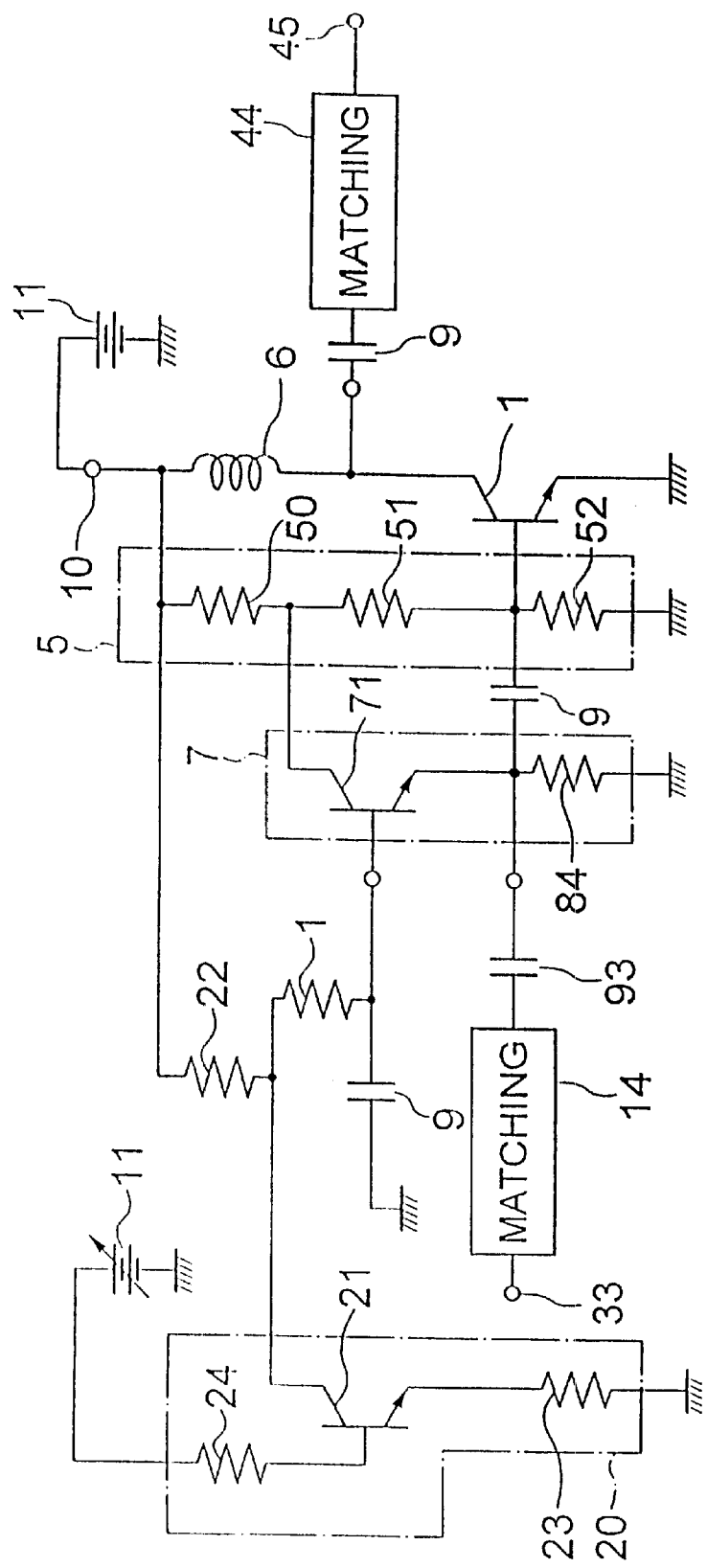
FIG. 31 is a circuit diagram of a practical example 5 of the variable-gain of the present invention.

Referring to FIG. 31, the present example is configured based on example 2 of FIG. 27 by connecting together the output from the control voltage generator 11 and the control terminal via an inverting amplifier 20. The inverting amplifier 20 includes a transistor 21, a 6 kΩ collector resistor 22, a 3 kΩ emitter resistor 23 and a 5 kΩ base resistor 24.

Figure 32:
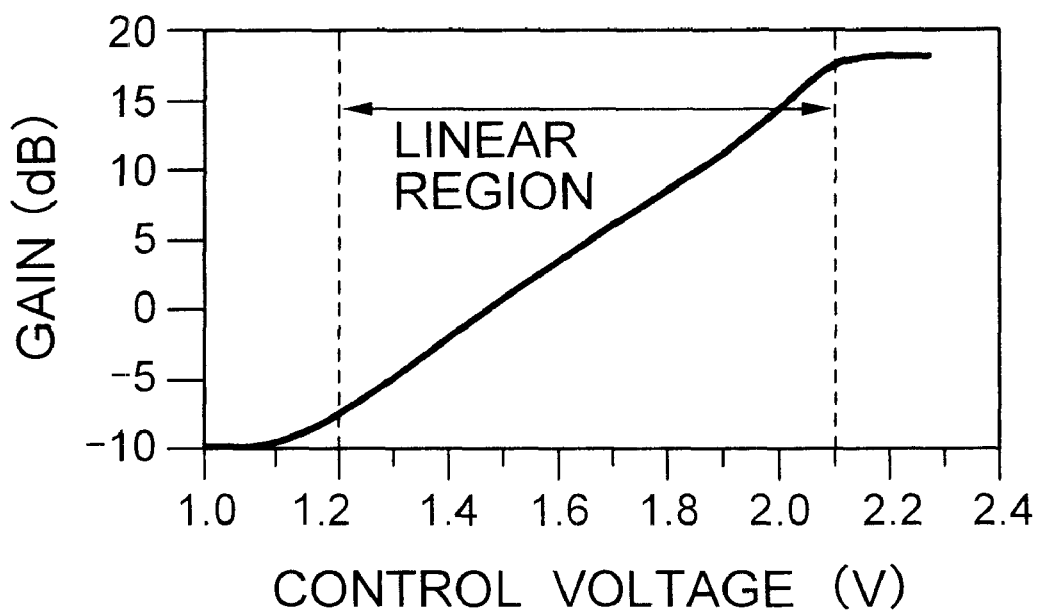
FIG. 32 shows the gain curve of decibel gain obtained by the variable-gain shown in FIG. 31

An input signal having a frequency of 2 GHz and a power of 1 kW applied to the present example exhibited a gain curve which increases in proportion to an increased applied voltage, as shown in FIG. 32. Addition of the inverting amplifier may degrade the linearity of the gain curve. However, the linearity can be improved or recovered by adjusting the resistance of resistor 50 of the base bias circuit 5.

Although the present example is modified from the configuration of FIG. 27, the modification by addition of the inverting amplifier can be applied to other examples 1, 3 and 4 recited before.

The practical values for the resistors, input signal etc. are recited in this text for an exemplification purpose, and should be modified based on the circuit configuration, purpose of the circuit and transistor characteristics in the circuit.

The above examples are applied to GaAs-HBTs. However, the present invention can be applied to other bipolar transistors such as Si bipolar transistors and SiGe-HBTs.

Since the above embodiments are described only for examples, the present invention is not limited to the above embodiments and various modifications or alterations can be easily made therefrom by those skilled in the art without departing from the scope of the present invention.

What is claimed is:

1. A variable-gain circuit comprising a functional circuit for receiving an input signal to output an output signal having a gain with respect said input signal, a first gain control section for receiving a first control signal to control said functional circuit to operate based on a first gain curve of decibel gain plotted in a graph against said first control signal, said first gain curve being convex toward a bottom of the graph, a second gain control section for receiving a second control signal to control said functional circuit to operate based on a second gain curve of decibel gain plotted in a graph against said second control voltage, said second gain curve being convex toward a top of the graph, said first and second control signals being applied so that said first gain curve and said second gain curve cancel each other in non-linearity.

2. The variable-gain circuit as defined in claim 1, wherein said functional circuit is an amplifier.

3. The variable-gain circuit as defined in claim 2, wherein said first gain control circuit includes a shunt circuit for shunting said input signal, and said second gain control section includes a bias control circuit for controlling a bias for said amplifier.

4. The variable-gain circuit as defined in claim 3, wherein said shunt circuit includes a variable-impedance, and said bias circuit includes a variable current source.

5. The variable-gain circuit as defined in claim 2, wherein said amplifier includes a common base transistor.

6. The variable-gain circuit as defined in claim 5, wherein said second gain control section includes a variable current source for controlling a base current for said common base transistor.

7. The variable-gain circuit as defined in claim 2, wherein said amplifier includes a common emitter transistor.

8. The variable-gain circuit as defined in claim 2, wherein said amplifier includes an amplifying transistor, and said second gain control circuit includes a first transistor cascoded to said amplifying transistor, and a base bias circuit for controlling a base bias current for said first transistor.

9. The variable-gain circuit as defined in claim 1, wherein said functional circuit includes a first transistor having a common emitter connection and a base connected to a base bias circuit for receiving said input signal, said first gain control section includes a second transistor having an emitter connected to said base of said first transistor via a capacitor, and said second gain control section includes a third transistor having a collector connected to said bias circuit and an emitter connected to a reference potential line.

10. The variable-gain circuit as defined in claim 1, wherein said functional circuit includes a first transistor having a common base connection and an emitter connected to an input terminal via a capacitor for receiving said input signal, said first gain control section includes a variable-impedance connected between said input terminal and a reference potential line, and said second gain control section includes a variable current source connected between a power source line and said base of said first transistor via resistors.

11. The variable-gain circuit as defined in claim 1, wherein said functional circuit includes a first transistor having a common collector connection and a base connected to an input terminal via a capacitor for receiving said input signal, said first gain control section includes a variable-impedance connected between said input terminal and a reference potential line, and said second gain control section includes a variable current source connected between a power source line and said base of said first transistor via resistors.

12. A variable-gain circuit comprising a first transistor having an emitter common connection and a base connected to an input terminal via a capacitor for receiving an input signal, a base bias circuit including first through third resistors, said base of said first transistor being connected to a first node connecting said first and second resistors together, a second transistor having a base for receiving a gain control signal, a collector connected to a node connecting said second and third resistors together, and an emitter connected to said input terminal and to a reference potential line via a fourth resistor.

* * * * *